United States Patent
Hsieh et al.

(10) Patent No.: US 8,581,093 B2
(45) Date of Patent: Nov. 12, 2013

(54) OPTOELECTRONICAL SEMICONDUCTOR DEVICE

(75) Inventors: Min-Hsun Hsieh, Hsinchu (TW);
Pai-Hsiang Wang, Hsinchu (TW);
Ta-Cheng Hsu, Hsinchu (TW);
Yeung-Sy Su, Hsinchu (TW)

(73) Assignee: Epistar Corporation (TW)

( * ) Notice: Subject to any disclaimer, the term of this patent is extended or adjusted under 35 U.S.C. 154(b) by 497 days.

(21) Appl. No.: 12/068,887

(22) Filed: Feb. 13, 2008

(65) Prior Publication Data

US 2008/0190479 A1    Aug. 14, 2008

(30) Foreign Application Priority Data

Feb. 13, 2007 (TW) ................................ 96105579 A (51) Int. Cl.
*H01L 31/05* (2006.01)
(52) U.S. Cl.
USPC ............................ 136/256; 136/252; 136/255
(58) Field of Classification Search
USPC ................ 136/243–265; 438/57–98
See application file for complete search history.

(56) References Cited

U.S. PATENT DOCUMENTS

| | | | | |
|---|---|---|---|---|
| 4,316,049 A | * | 2/1982 | Hanak | 136/244 |
| 4,680,422 A | * | 7/1987 | Stanbery | 136/249 |
| 4,795,501 A | * | 1/1989 | Stanbery | 136/249 |
| 4,907,052 A | | 3/1990 | Takada et al. | |
| 5,021,099 A | * | 6/1991 | Kim et al. | 136/249 |
| 5,458,694 A | | 10/1995 | Nuyen | |
| 5,479,043 A | | 12/1995 | Nuyen | |
| 5,853,497 A | | 12/1998 | Lillington et al. | |
| 6,593,522 B2 | | 7/2003 | Nakano et al. | |
| 2004/0065363 A1 | * | 4/2004 | Fetzer et al. | 136/262 |
| 2004/0106225 A1 | | 6/2004 | Hsieh et al. | |
| 2004/0206389 A1 | | 10/2004 | Takamoto et al. | |
| 2005/0150544 A1 | * | 7/2005 | Fukui et al. | 136/263 |

FOREIGN PATENT DOCUMENTS

JP      2000-277797      10/2000

OTHER PUBLICATIONS

Stanbery et al. "Lightweight Tandem GaAs/CuInSe2 Solar Cells". IEEE Transactions on electron devices, vol. 37, No. 2, Feb. 1990, pp. 438-442.*

* cited by examiner

*Primary Examiner* — Jeffrey T Barton
*Assistant Examiner* — Christina Chern
(74) *Attorney, Agent, or Firm* — Bacon & Thomas, PLLC (57) ABSTRACT

An optoelectronical semiconductor device having a bonding structure comprises a first optoelectronical structure, a second optoelectronical structure, and a transparent bonding structure formed in-between.

15 Claims, 7 Drawing Sheets

OPTOELECTRONICAL SEMICONDUCTOR DEVICE

REFERENCE TO RELATED APPLICATION

The present application claims the right of priority based on Taiwan Application Serial Number 096105579, filed Feb. 13, 2007, the disclosure of which is incorporated herein by reference in its entirety.

TECHNICAL FIELD

This invention relates to a semiconductor optoelectronical device having a bonding structure.

BACKGROUND OF THE DISCLOSURE

The global tendency toward high development reveals the problem of energy shortage that is urged to be resolved. In contrast to the exhaustion of petroleum anticipated in the near future, solar energy is deemed to replace petroleum. One way converting solar energy into electricity is to utilize a semiconductor material having a specific band gap to form a p-n junction. The carriers (holes/electrons) on the lateral sides of the p-n junction absorb photons having energy larger than that of the specific band gap, and then combine together to generate current. Solar cell made of polycrystalline silicon is popular presently although its converting efficiency is still low, about 10% to 15%. Because polycrystalline silicon is easy to be obtained and the cost thereof is low, it is still utilized and popular extensively. Because the band gap of silicon is 1.12 eV, it can absorb only a portion of the range of wavelength within the infrared in the spectrum. To increase the power, the area of the solar panel must be increased as well, thus the application is inconvenient.

Multi-junction tandem solar cell structure is acknowledged as a structure with the highest converting efficiency. For example, the tandem structure of Ge/GaAs/GaInP is triple junctions whose crystal lattices are matching with each other. The top cell made of $Ga_xIn_{1-x}P$ (1.85 eV; x~0.5) has larger band gap which can receive photons of higher energy within the range of wavelength from ultraviolet to visible light. A middle cell made of GaAs has band gap of 1.42 eV, which can receive photons whose wavelength within the range close to infrared. A bottom cell made of Ge has lower band gap of 0.74 eV, which can receive photons from the light passing the first two cells and having wavelength within the range of infrared. Because the range of the solar radiation spectrum the structure receives is more extensive, the converting efficiency is increased to over 30%.

The converting efficiency of tandem solar cell depends on a lot of factors. For example, there are options about the materials of the tandem by different band gaps for receiving more extensive solar radiation spectrum, optimization of thickness of each layer for tuning short-circuit current ($I_{sc}$) or open-circuit voltage ($V_{oc}$) of the solar cell for increasing power, or extent of the epitaxy lattice-match of each layer to reduce the lattice-defects for increasing the converting efficiency.

Owing to the lattice constant of the material itself, when the lattice-mismatch between a substrate and a material of a lower layer occurs, the film growing on the substrate can result in lattice-defects and inferior quality. The usual way to solve lattice-mismatch in multi-junction tandem solar cell is to add a transparent buffer layer between the two layers mismatching with each other. For example, there is a research that a double-junction of the GaAs/GaInAs series forms a solar cell structure of a combination of 1.42 eV/1.1 eV to replace the known GaAs/Ge cell structure. Because the lattice constant of the $Ga_yIn_{1-y}As$ having band gap of 1.1 eV(y~0.8) is 5.75 Å mismatching to the that of GaAs and the extent of lattice-mismatch is still as high as 1.8%, another usual way is to grow a transparent graded layer between the GaAs cell and GaInAs series cell. The material of the transparent graded layer can be $Ga_xIn_{1-x}P$ series. The lattice constant of $Ga_xIn_{1-x}P$ can be increased from 5.65 Å (x~0.5) to 5.75 Å (x~0.25) by increasing the content of In gradually. Therefore, one surface of the graded layer of GaInP series matches with the GaAs cell and another surface thereof matches with the GaInAs cell to solve the problem of lattice-match.

For higher converting efficiency, a multi-junction tandem solar cell structure having more junctions makes it more difficult to choose the materials Thus, the present invention provides a bonding structure of an optoelectronical semiconductor device to offer another solution to solve the problem of connecting two different materials.

SUMMARY OF THE DISCLOSURE

The present invention provides an optoelectronical semiconductor device having a bonding structure including a first optoelectronical structure, a second optoelectronical structure, and a transparent bonding structure formed in-between the first optoelectronical structure and the second optoelectronical structure to connect therewith electrically. The transparent bonding structure includes a first conductive layer, a second conductive layer, and a transparent adhesive layer formed in-between the first conductive layer and the second conductive layer to connect therewith electrically, wherein a surface for the first conductive layer and/or the second conductive layer to contact with each other includes an uneven surface.

In another aspect, the present invention provides an optoelectronical semiconductor device having a bonding structure including a first optoelectronical structure, a second optoelectronical structure, and a transparent bonding structure formed in-between the first optoelectronical structure and the second optoelectronical structure to connect therewith electrically. The transparent bonding structure includes a plurality of metal bulks distributed in-between the first optoelectronical structure and the second optoelectronical structure, and a transparent adhesive layer distributed into the space among the plurality of metal bucks.

In further aspect, the present invention provides a solar cell device having a bonding structure including a first cell structure, a second cell structure, and a transparent bonding structure formed in-between the first cell structure and the second cell structure.

In another aspect, the present invention provides a light-emitting device having a bonding structure including a first light-emitting stack, a second light-emitting stack, and a transparent bonding structure formed in-between the first light-emitting stack and the second light-emitting stack.

DETAILED DESCRIPTION OF THE PREFERRED EMBODIMENTS

Figure 1:
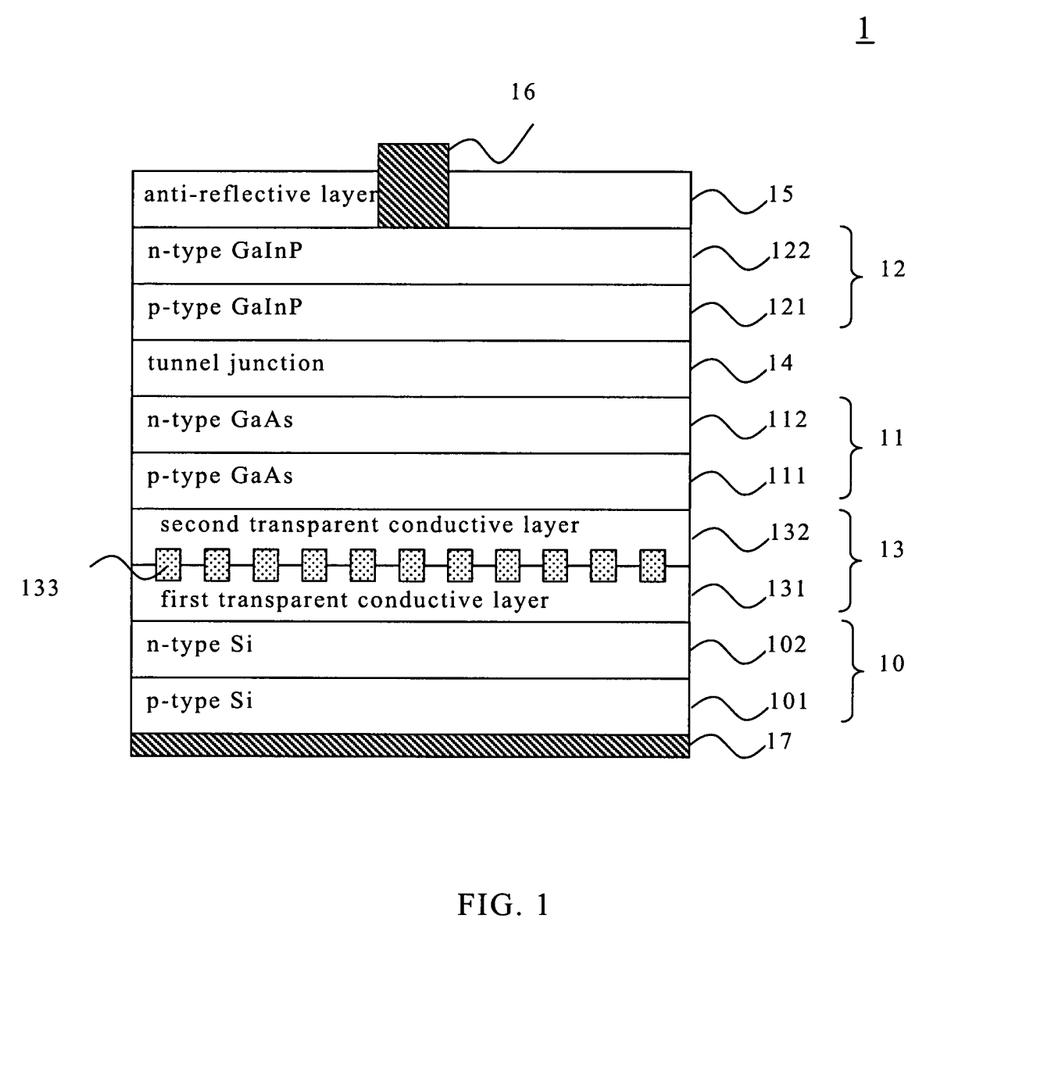
FIG. 1 is schematic diagram showing a solar cell device in accordance with the present invention.

FIG. 1 shows one embodiment according to the present invention. A solar cell device 1 is stacked by a silicon (Si) cell structure 10 at least including a first p-n junction composed of a p-type Si layer 101 and an n-type Si layer 102; a GaAs series cell structure 11 at least including a second p-n junction composed of a p-type GaAs layer 111 and an n-type GaAs layer 112; and a GaInP series cell structure 12 at least including a third p-n junction composed of a p-type GaInP layer 121 and an n-type GaInP layer 122. A tunnel junction 14 is formed in-between the GaAs series cell structure 11 and the GaInP series cell structure 12 whose lattices match with each other to connect the cell structures electrically, wherein the tunnel junction 14 is composed of highly doped p-type and n-type semiconductors. The band gap of a material of the tunnel junction 14 is not less than that of the second p-n junction, preferably not less than that of the third p-n junction, to make the tunnel junction 14 transparent to the rest solar spectrum passing the GaInP series cell structure 12. The material can be AlGaAs series or GaInP series. A transparent bonding structure 13 is formed in-between the Si cell structure 10 and the GaAs series cell structure 11 whose lattices mismatch with each other. The transparent bonding structure 13 includes transparent conductive layers 131 and 132 formed respectively on surfaces of the Si cell structure 10 and the GaAs series cell structure 11 opposite to each other, and a transparent adhesive layer 133 formed in-between the transparent conductive layers 131 and 132 to connect therewith electrically, wherein the light transmission of the transparent bonding structure 13 is at least 60% of the rest solar spectrum passing the GaAs series cell structure 11. The transparent conductive layers 131 and/or 132 include uneven surfaces for better adhesion. For example, continuous surfaces or intermittent surfaces having regular or irregular patterns are formed by conventional lithography or etching process. A material of the transparent adhesive layer 133 can be filled into the space formed by adjoining the transparent conductive layers 131 and 132 during the bonding process to increase the bonding strength. The transparent conductive layers 131 and 132 include transparent conductive oxide layers or thin metal layers. The transparent conductive oxide layers can be indium tin oxide, cadmium tin oxide, antimony tin oxide, zinc tin oxide, or ZnO. Thin metal layers include metal layers with smaller thickness less than 100 Å such that the light transmission of the transparent bonding structure 13 is larger than 60%. Materials of the thin metal layers can be BeAu, GeAu, NiAu, Pt, or Pd. At least one material of the transparent adhesive layer 133 is selected from the group consisting of PI, BCB, PFCB, Epoxy resin, and Silicone. The solar cell device 1 further includes an anti-reflective layer 15 formed on the GaInP series cell structure 12 for reducing the reflection of a surface thereof, a top electrode 16 formed on the GaInP series cell structure 12, and a bottom electrode 17 formed on a bottom of the Si cell structure 10, wherein the top electrode 16 and the bottom electrode 17 conduct the current generated by the solar cell device 1 to an external power supply, converting, or storage device.

Figure 2:
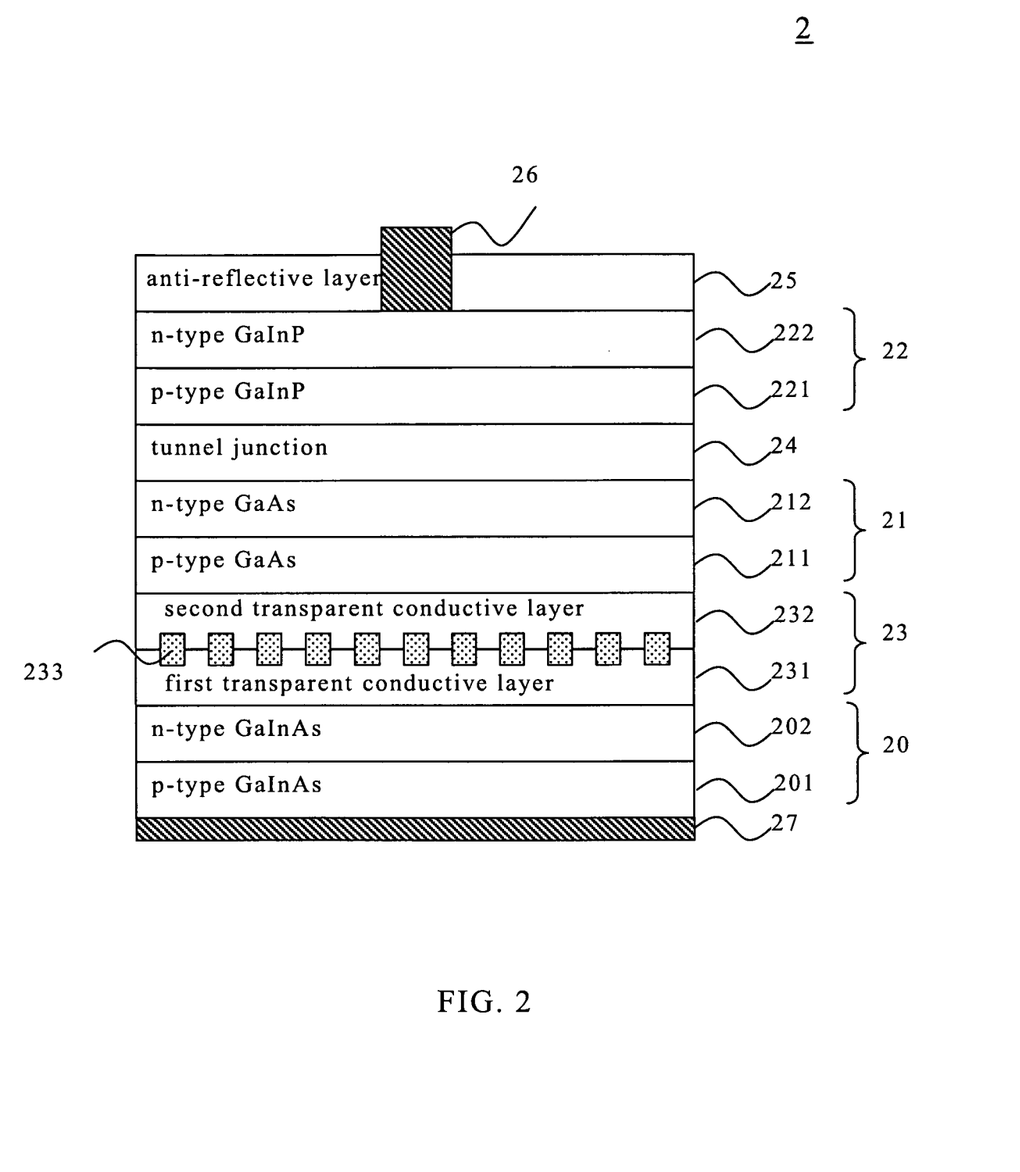
FIG. 2 is schematic diagram showing another solar cell device in accordance with the present invention.

FIG. 2 shows another embodiment according to the present invention. A solar cell device 2 is stacked by a GaInAs series cell structure 20 at least including a first p-n junction composed of a p-type GaInAs layer 201 and an n-type GaInAs layer 202, a GaAs series cell structure 21 at least including a second p-n junction composed of a p-type GaAs layer 211 and an n-type GaAs layer 212, and a GaInP series cell structure 22 at least including a third p-n junction composed of a p-type GaInP layer 221 and an n-type GaInP layer 222. A tunnel junction 24 is formed in-between the GaAs series cell structure 21 and the GaInP series cell structure 22 whose lattices match with each other to connect therewith electrically, wherein the tunnel junction 24 is composed of highly doped p-type and n-type semiconductors. The band gap of a material of the tunnel junction 24 is not less than that of the second p-n junction, preferably not less than that of the third p-n junction, to make the tunnel junction 24 transparent to the rest solar spectrum passing GaInP series cell structure 22. The material can be AlGaAs series or GaInP series. A transparent bonding structure 23 is formed between the GaInAs series cell structure 20 and the GaAs series cell structure 21 whose lattices mismatch with each other. The transparent bonding structure 23 includes transparent conductive layers 231 and 232 respectively formed on surfaces of the GaInAs series cell structure 20 and the GaAs series cell structure 21 opposite to each other, and a transparent adhesive layer 233 formed in-between the transparent conductive layers 231 and 232 to connect therewith electrically, wherein the light transmission of the transparent bonding structure 23 is at least 60% of the rest solar spectrum passing the GaAs series cell structure 21. The transparent conductive layers 231 and/or 232 include uneven surfaces for better adhesion. For example, continuous surfaces or intermittent surfaces having regular or irregular patterns are formed by conventional lithography or etching process. A material of the transparent adhesive layer 233 can be filled into the space formed by adjoining the transparent conductive layers 231 and 232 during the bonding process to increase the bonding strength. The transparent conductive layers 231 and 232 include transparent conductive oxide layers or thin metal layers. The transparent conductive oxide layers can be indium tin oxide, cadmium tin oxide, antimony tin oxide, zinc tin oxide, or ZnO. The thin metal layers include metal layers with smaller thickness less than 100 Å such that the light transmission of the transparent bonding structure 23 is larger than 60%. Materials of the thin metal layers can be BeAu, GeAu, NiAu, Pt, or Pd. At least one material of the transparent adhesive layer 233 is selected from the group consisting of PI, BCB, PFCB, Epoxy resin, and Silicone. The solar cell device 2 further includes an anti-reflective layer 25 formed on the GaInP series cell structure 22 for reducing the reflection of a surface thereof, a top electrode 26 formed on the GaInP series cell structure 22, and a bottom electrode 27 formed on a bottom of the GaInAs series cell structure 20, wherein the top electrode 26 and the bottom electrode 27 conduct the current generated by the solar cell device 2 to an external power supply, converting, or storage device.

Figure 3:
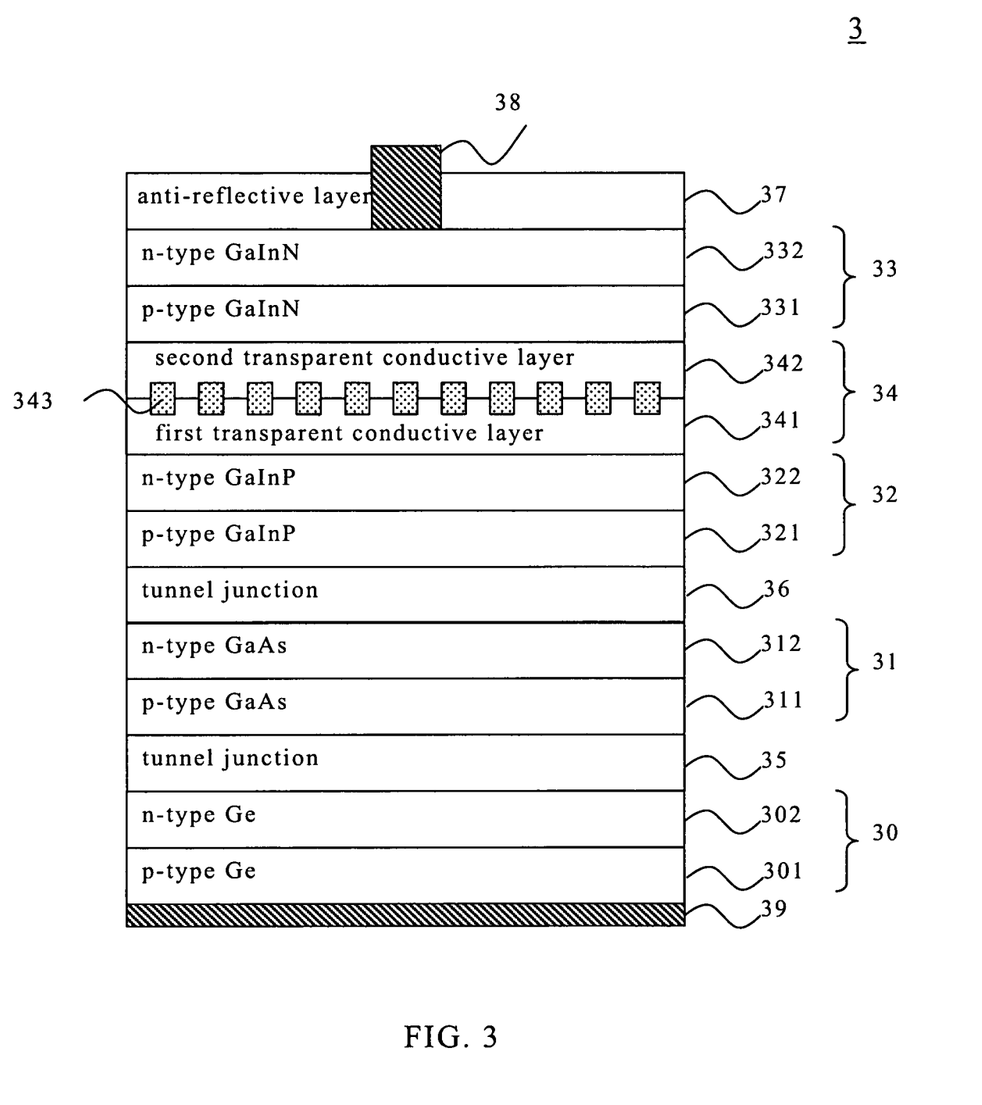
FIG. 3 is schematic diagram showing the third embodiment of the solar cell device in accordance with the present invention.

FIG. 3 shows another embodiment according to the present invention. A solar cell device 3 is stacked by a Ge cell structure 30 at least including a first p-n junction composed of a p-type Ge layer 301 and an n-type Ge layer 302, a GaAs series cell structure 31 at least including a second p-n junction composed of a p-type GaAs layer 311 and an n-type GaAs layer 312, a GaInP series cell structure 32 at least including a third p-n junction composed of a p-type GaInP layer 321 and an n-type GaInP layer 322, and a GaInN series cell structure 33 at least including a forth p-n junction composed of a p-type GaInN layer 331 and an n-type GaInN layer 332. The solar cell device 3 further includes a first tunnel junction 35 is formed in-between the Ge cell structure 30 and the GaAs series cell structure 31 whose lattices match with each other to connect therewith electrically, and a second tunnel junction 36 is formed in-between the GaAs cell structure 31 and the GaInP series cell structure 32 whose lattices match with each other to connect therewith electrically, wherein the first tunnel junction 35 and the second tunnel junction 36 are composed of highly doped p-type and n-type semiconductors respectively. The band gap of a material of the first tunnel junction 35 is not less than that of the first p-n junction, preferably not less than that of the second p-n junction, to make the first tunnel junction 35 transparent to the rest solar spectrum passing GaAs series cell structure 31. It can be a material of AlGaAs series or GaAs series. The band gap of a material of the second tunnel junction 36 is not less than that of the second p-n junction, preferably not less than that of the third p-n junction, to make the second tunnel junction 36 transparent to the rest solar spectrum passing GaInP series cell structure 32. It can be a material of AlGaAs series or GaInP series. A transparent bonding structure 34 is formed in-between the GaInP series cell structure 32 and the GaInN series cell structure 33 whose lattices mismatch with each other. The transparent bonding structure 34 includes transparent conductive layers 341 and 342 respectively formed on surfaces of the GaInP series cell structure 32 and the GaInN series cell structure 33 opposite to each other, and a transparent adhesive layer 343 formed in-between the transparent conductive layers 341 and 342 to connect therewith electrically, wherein the light transmission of the transparent bonding structure 34 is at least 60% of the rest solar spectrum passing the GaInN series cell structure 33. The transparent conductive layers 341 and/or 342 include uneven surfaces for better adhesion. For example, continuous surfaces or intermittent surfaces having regular or irregular patterns are formed by conventional lithography or etching process. A material of the transparent adhesive layer 343 can be filled into the space formed by adjoining the transparent conductive layers 341 and 342 during the bonding process to increase the bonding strength. The transparent conductive layers 341 and 342 include transparent conductive oxide layers or thin metal layers. The transparent conductive oxide layers can be indium tin oxide, cadmium tin oxide, antimony tin oxide, zinc tin oxide, or ZnO. The thin metal layers include metal layers with smaller thickness less than 100 Å such that the light transmission of the transparent bonding structure 34 is larger than 60%. Materials of the thin metal layers can be BeAu, GeAu, NiAu, Pt, or Pd. At least one material of the transparent adhesive layer 343 is selected from the group consisting of PI, BCB, PFCB, Epoxy resin, and Silicone. The solar cell device 3 further includes an anti-reflective layer 37 formed on the GaInN series cell structure 33 for reducing the reflection of a surface thereof, a top electrode 38 formed on the GaInN series cell structure 33, and a bottom electrode 39 formed on a bottom of the Ge series cell structure 30, wherein the top electrode 38 and the bottom electrode 39 conduct the current generated by the solar cell device 3 to an external power supply, converting, or storage device.

Figure 4:
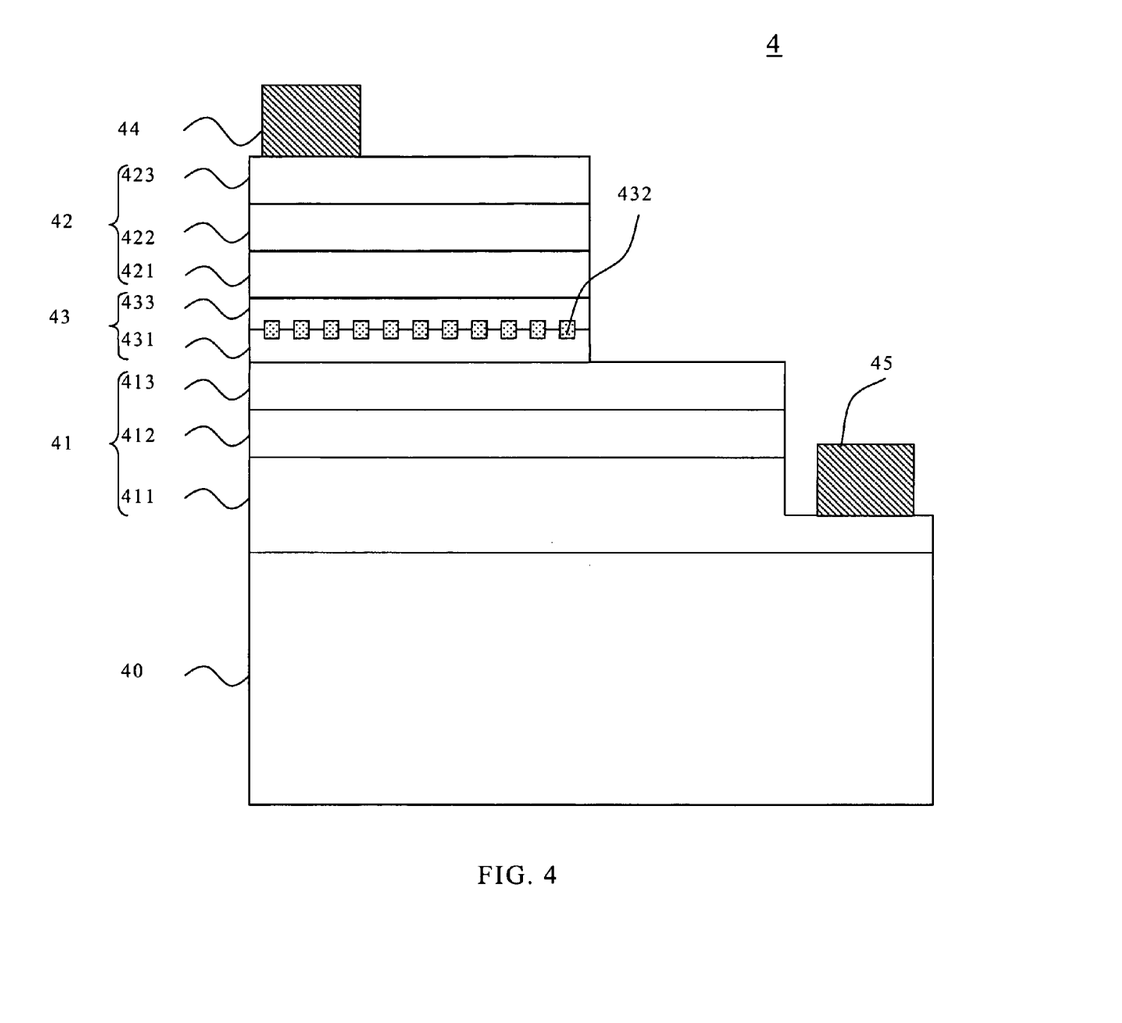
FIG. 4 is schematic diagram showing a light-emitting device in accordance with the present invention.

FIG. 4 shows another embodiment according to the present invention. A light-emitting device 4 includes a substrate 40, a first light-emitting stack 41 of $(Al_aGa_{1-a})_{0.5}In_{0.5}P$ series formed on the substrate 40, and a second light-emitting stack 42 of $Al_bIn_cGa_{(1-b-c)}N$ series formed on the first light-emitting stack 41. The first light-emitting stack 41 and the second light-emitting stack 42 can emit lights having different range of wavelength when they are operated. For example, the first light-emitting stack 41 can emit red, yellow, or green light depending on the proportion a of Al in the composition. The second light-emitting stack 42 can emit blue, green, or violet light depending on the proportion b of Al and the proportion c of In in the composition. The band gap of the second light-emitting stack 42 is larger than that of the first light-emitting stack 41 to prevent the light emitted from the first light-emitting stack 41 from being absorbed by the second light-emitting stack 42. The first light-emitting stack 41 includes a first n-type cladding layer 411, a first p-type cladding layer 413, and a first active layer 412 formed in-between the first n-type cladding layer 411 and the first p-type cladding layer 413. The second light-emitting stack 42 includes a second n-type cladding layer 421, a second p-type cladding layer 423, and a second active layer 422 formed in-between the second n-type cladding layer 421 and the second p-type cladding layer 423. A transparent bonding structure 43 is formed in-between the first light-emitting stack 41 and the second light-emitting stack 42 whose lattices mismatch with each other. The transparent bonding structure 43 includes a first transparent conductive layer 431 and a second transparent conductive layer 432 formed respectively on surfaces of the first light-emitting stack 41 and the second light-emitting stack 42 opposite to each other, and a transparent adhesive layer 433 formed in-between the first transparent conductive layer 431 and the second transparent conductive layer 432 to connect therewith electrically, wherein the light transmission of the transparent bonding structure 43 is at least 60% of the light emitted from the first light-emitting stack 41, preferably at least 80% for increasing light extraction efficiency. The first transparent conductive layer 431 and/or the second transparent conductive layer 432 include uneven surfaces for better adhesion. For example, continuous surfaces or intermittent surfaces having regular or irregular patterns are formed by conventional lithography or etching process. A material of the transparent adhesive layer 433 can be filled into the space formed by adjoining the first transparent conductive layer 431 and the second transparent conductive layer 432 during the bonding process to increase the bonding strength. The first transparent conductive layer 431 and the second transparent conductive layer 432 include transparent conductive oxide layers or thin metal layers. The transparent conductive oxide layers can be indium tin oxide, cadmium tin oxide, antimony tin oxide, zinc tin oxide, or ZnO. The thin metal layers include metal layers with smaller thickness less than 100 Å such that the light transmission of the transparent bonding structure 43 is larger than 60%. Materials of the thin metal layers can be BeAu, GeAu, NiAu, Pt, or Pd. At least one material of the transparent adhesive layer 433 is selected from the group consisting of PI, BCB, PFCB, Epoxy resin, and Silicone. In addition, a portion of the second light-emitting stack 42, the transparent bonding structure 43, and the first light-emitting stack 41 are removed to expose a portion of the first n-type cladding layer 411, and the second light-emitting stack 42 is stacked on a portion of the light-emitting stack 41. The light-emitting device 4 further includes a first electrode 44 formed on the exposed portion of the first n-type cladding layer 411 and supplied with a first potential, and a second electrode 45 formed on the second p-type cladding layer 423 and supplied with a second potential, wherein the first potential is smaller than the second potential. The lights emitted from the first light-emitting stack 41 and the second light-emitting stack 42 are mixed to form the light having the third spectrum characteristic such as white light when in operation.

Figure 5:
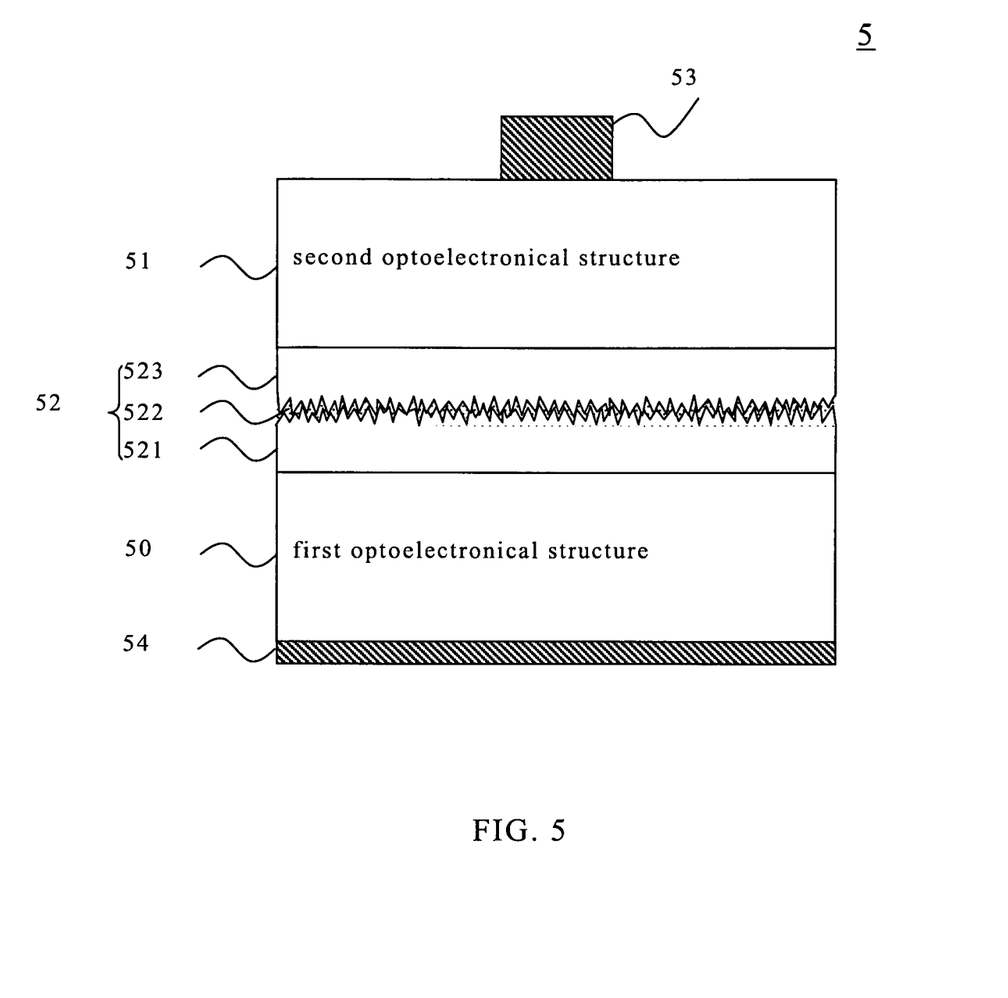
FIG. 5 is schematic diagram showing another embodiment of the bonding structure in accordance with the present invention.

FIG. 5 shows another embodiment according to the present invention. An optoelectronical semiconductor device 5 includes a first optoelectronical structure 50, a second optoelectronical structure 51, a transparent bonding structure 52, a top electrode 53, and a bottom electrode 54. The first optoelectronical structure 50 and the second optoelectronical structure 51 can be the solar cell structures or the light-emitting stack structures disclosed in the aforementioned embodiments. In addition, the transparent bonding structure 52 includes transparent conductive layers 521 and/or 522 whose surfaces are rough. For example, the rough surfaces can be formed randomly by mechanical polish or other physical, chemical methods. Controlling the parameters of film deposition also can form the rough surface. A material of a transparent adhesive layer 523 can be filled into the space formed by adjoining the first transparent conductive layer 521 and the second transparent conductive layer 522 during the bonding process to increase the bonding strength.

Figure 6:
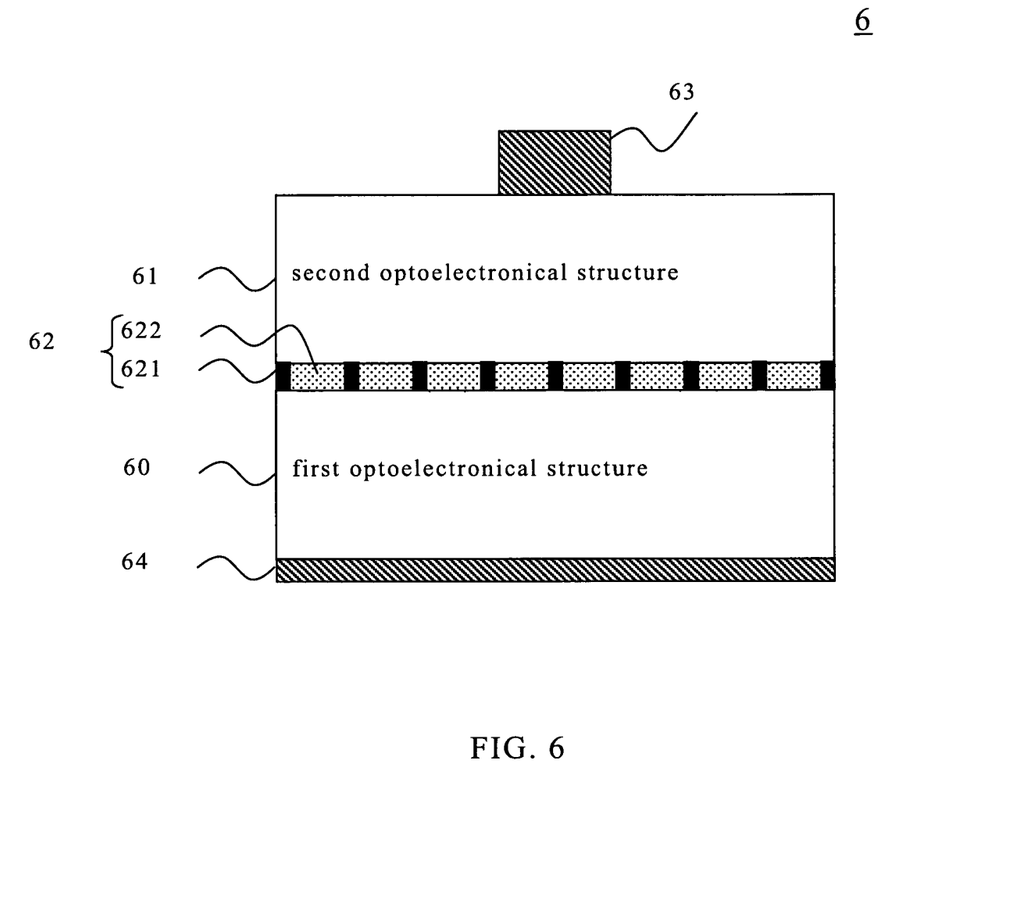
FIG. 6 is schematic diagram showing the third embodiment of the bonding structure in accordance with the present invention.

FIG. 6 shows another embodiment according to the present invention. An optoelectronical semiconductor device 6 includes a first optoelectronical structure 60, a second optoelectronical structure 61, a transparent bonding structure 62, a top electrode 63, and a bottom electrode 64. The first optoelectronical structure 60 and the second optoelectronical structure 61 can be the solar cell structures or the light-emitting stack structures disclosed in the aforementioned embodiments. In addition, the transparent bonding structure 62 includes a plurality of metal bulges 621 distributed in-between the two aforementioned optoelectronical structures, and a material of a transparent adhesive layer 622 filled into the space thereof to increase the bonding strength. The plurality of metal bulges covers less 30% of the surfaces of the first optoelectronical structure 60 or the second optoelectronical structure 61 to make the light transmission of the transparent bonding structure 62 larger than 60% for maintaining the transparency of transparent conductive structures. The plurality of metal bulges includes at least one material selected form the group consisting of BeAu, GeAu, NiAu, Pt, and Pd.

Figure 7:
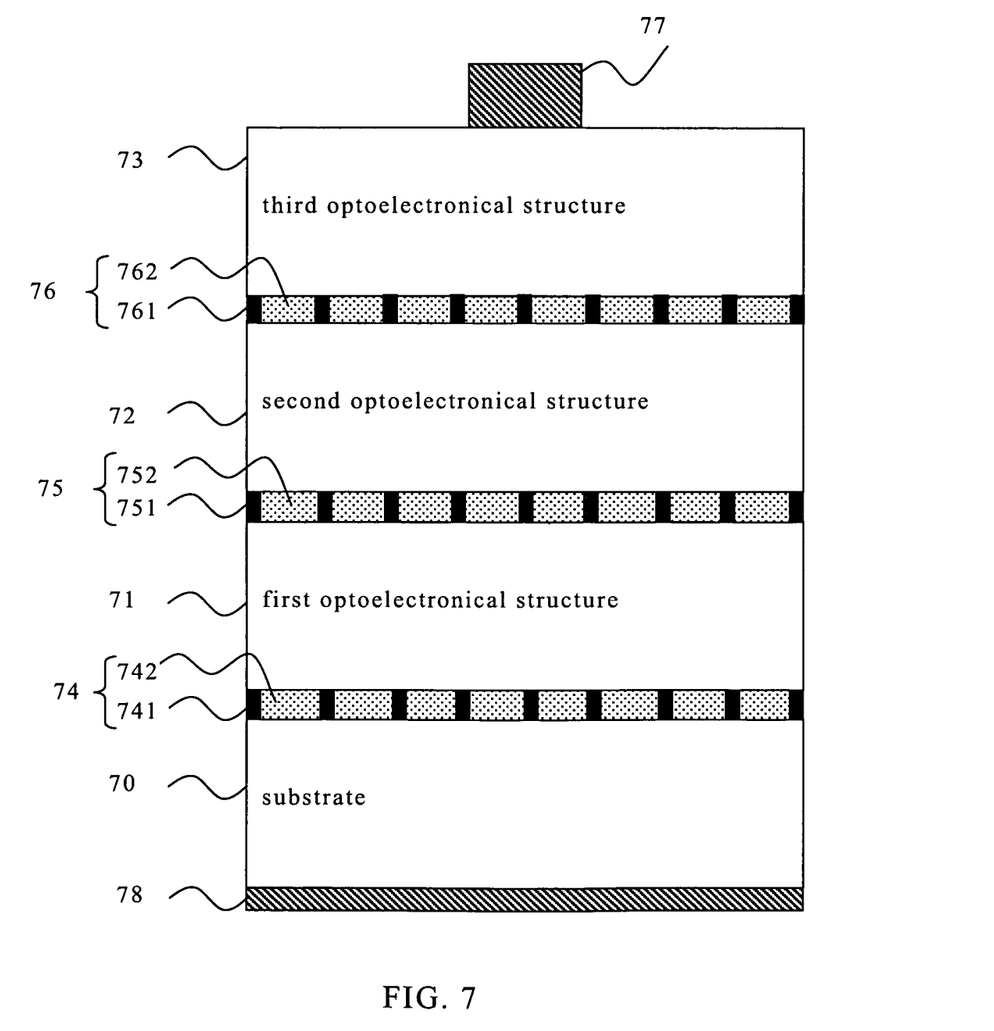
FIG. 7 is schematic diagram showing another embodiment in accordance with the present invention.

FIG. 7 shows another embodiment according to the present invention. An optoelectronical semiconductor device 7 includes a substrate 70, a first optoelectronical structure 71, a second optoelectronical structure 72, a third optoelectronical structure 73, a first transparent bonding structure 74, a second transparent bonding structure 75, a third transparent bonding structure 76, a top electrode 77, and a bottom electrode 78. The first optoelectronical structure 71, the second optoelectronical structure 72, and the third optoelectronical structure 73 can be the solar cell structures or the light-emitting stack structures disclosed in the aforementioned embodiments. In addition, the transparent bonding structures 74, 75, and 76 include a plurality of metal bulges 741, 751, and 761 distributed in-between every two near optoelectronical structures mentioned above, and materials of the transparent adhesive layers 742, 752, and 762 filled into the space thereof for increasing the bonding strength. The transparent adhesive layers 742, 752, and 762 include a plurality of sub-layers (not shown) comprising different thicknesses and materials, and therefore the plurality of sub-layers includes different refractive indices. Because of the different refractive indices among the plurality of sub-layers, the transparent adhesive layers 742, 752, and 762 can perform as DBR (Distributed Bragg Reflector). Each of the transparent adhesive layers 742, 752, and 762 comprises at least two different materials selected from the group consisting of polyimide, benzocyclobutene (BCB), perfluorocyclobutane (PFCB), epoxy, Su8, indium tin oxide, $SiN_x$, spin-on glass (SOG), $SiO_2$, $TiO_2$, or MgO. If the first optoelectronical structure 71, the second optoelectronical structure 72, and the third optoelectronical structure 73 are the light-emitting stack structures, the light transmission of the transparent bonding structures 75 and 76 is at least 60% of the lights emitted from the first optoelectronical structure 71 and the second optoelectronical structure 72 respectively, preferably at least 80%, for increasing the light extraction efficiency. In addition, the transparent adhesive layers 742, 752, and 762 can reflect the lights emitted from the first optoelectronical structure 71, the second optoelectronical structure 72, and the third optoelectronical structure 73 respectively. On the other hand, if the first optoelectronical structure 71, the second optoelectronical structure 72, and the third optoelectronical structure 73 are the solar cell structures, the light transmission of the transparent bonding structures 75 and 76 is at least 60% of the rest solar spectra passing the second optoelectronical structure 72 and the third optoelectronical structure 73 respectively, preferably at least 80%. Moreover, the transparent adhesive layers 742, 752, and 762 can reflect the solar spectra whose energy larger than or equal to the band gaps of the first optoelectronical structure 71, the second optoelectronical structure 72, and the third optoelectronical structure 73 respectively. The plurality of metal bulges covers less 30% of the surfaces of the first optoelectronical structure 71, the second optoelectronical structure 72, or the third optoelectronical structure 73 to make the light transmission of the transparent bonding structures 74, 75 and 76 larger than 60% for maintaining the transparency of transparent conductive structures. The plurality of metal bulges includes at least one material selected form the group consisting of BeAu, GeAu, NiAu, Pt, and Pd.

The GaInP series of the aforementioned embodiments represents $Ga_xIn_{1-x}P$ ($0 \leq x \leq 1$) whose value of x is arbitrary. The GaInP mentioned everywhere in this specification does not imply that it includes the same composition of Ga or In. Identically, this situation can be analogized to the definition of the GaInAs series, AlGaAs series, and GaInN series.

Although the structures of the solar cell device disclosed in the aforementioned embodiments are the p-n junctions, they can be added intrinsic type semiconductor layers between the p-type semiconductor layers and the n-type semiconductor layers to form p-i-n junctions in order to obtain better recombination efficiency of carriers for improving the efficiency of the solar cell device.

It should be noted that the proposed various embodiments are not for the purpose to limit the scope of the invention. Any possible modifications without departing from the spirit of the invention may be made and should be covered by the invention.

What is claimed is:
1. An optoelectronical semiconductor device having a bonding structure, comprising:
a first optoelectronical structure comprising a first p-n or p-i-n junction;
a second optoetectronical structure comprising a second p-n or p-i-n junction; and
a transparent bonding structure formed in-between the first optoetectronical structure and the second optoelectronical structure to connect therewith electrically;
wherein the transparent bonding structure comprises a first conductive layer comprising a first bonding surface, a second conductive layer comprising a second bonding surface, and a transparent adhesive layer connecting the first conductive layer and the second conductive layer and sandwiched therebetween, and at least one of the first bonding surface and the second bonding surface is an uneven surface, and parts of the first bonding surface are directly in contact with that of the second bonding surface;

wherein the transparent adhesive layer does not directly contact the first optoelectronical structure and the second optoelectronical structure;

wherein the first conductive layer and/or the second conductive layer comprise a transparent metal oxide layer or a thin metal layer; and wherein the transparent metal oxide layer comprises at least one material selected from the group consisting of indium tin oxide, cadmium tin oxide, antimony tin oxide, zinc tin oxide, and ZnO.

2. The optoelectronical semiconductor device according to claim 1, wherein the uneven surfaces comprise rough surfaces and/or surfaces with at least one pattern.

3. The optoelectronical semiconductor device according to claim 1, wherein the uneven surfaces comprise intermittent surfaces.

4. The optoelectronical semiconductor device according to claim 1, wherein the first p-n or p-i-n junction comprises a first band gap and the second p-n or p-i-n junction comprises a second band gap different from the first band gap.

5. The optoelectronical semiconductor device according to claim 1, wherein the first optoelectronical structure and/or the second optoelectronical structure comprise at least two p-n or p-i-n junctions having different band gaps.

6. The optoelectronical semiconductor device according to claim 1, wherein the first optoelectronical structure and the second optoelectronical structure comprise a solar cell structure respectively.

7. The optoelectronical semiconductor device according to claim 6, wherein the light transmission of the transparent bonding structure of the rest solar spectrum passing the first optoelectronical structure and the second optoelectronical structure is at least 60%.

8. The optoelectronical semiconductor device according to claim 1, wherein the first p-n or p-i-n junction or the second p-n or p-i-n junction comprises at least one material selected from the group consisting of nitrides of III group, phosphides of III group, and arsenides of III group.

9. The optoelectronical semiconductor device according to claim 1, wherein lattices of the first p-n or p-i-n junction mismatch with that of the second p-n or p-i-n junction.

10. The optoelectronical semiconductor device according to claim 1, wherein the transparent adhesive layer comprises at least one material selected from the group consisting of PI, BCB, PFOB, epoxy resin, and silicone.

11. The optoelectronical semiconductor device according to claim 1, wherein the thickness of the thin metal layer is less than 100 Å.

12. The optoelectronical semiconductor device according to claim 1, wherein the thin metal layer comprises at least one material selected from the group consisting of BeAu, GeAu, NiAu, Pt, and Pd.

13. The optoelectronical semiconductor device according to claim 1, wherein the first optoelectronical structure is an Si-cell structure connected contiguously to the transparent bonding structure.

14. The optoelectronical semiconductor device according to claim 1, wherein the first optoelectronical structure and the second optoelectronical structure comprise a light-emitting structure respectively.

15. The optoelectronical semiconductor device according to claim 14, wherein the light transmission of the transparent bonding structure of the lights emitted from the first optoelectronical structure and the second optoelectronical structure is at least 60%.

* * * * *